United States Patent
Wu

(10) Patent No.: US 8,651,690 B2
(45) Date of Patent: Feb. 18, 2014

(54) LED LIGHT BAR AND BACKLIGHT MODULE

(75) Inventor: Wei-Hung Wu, Hsin-Chu (TW)

(73) Assignee: AU Optronics Corporation, Hsin-Chu (TW)

( * ) Notice: Subject to any disclaimer, the term of this patent is extended or adjusted under 35 U.S.C. 154(b) by 141 days.

(21) Appl. No.: 13/454,284

(22) Filed: Apr. 24, 2012

(65) Prior Publication Data
US 2013/0051070 A1    Feb. 28, 2013

(30) Foreign Application Priority Data
Aug. 26, 2011 (TW) .............................. 100130730 A

(51) Int. Cl.
*F21V 21/00* (2006.01)
(52) U.S. Cl.
USPC ..................................... 362/217.14; 362/609
(58) Field of Classification Search
USPC ........................................ 362/609, 217.14
See application file for complete search history.

(56) References Cited

U.S. PATENT DOCUMENTS

| 7,894,015 B2 | 2/2011 | Kawase | |
| 8,192,054 B2 * | 6/2012 | Grajcar | 362/294 |
| 8,310,043 B2 * | 11/2012 | Lin et al. | 257/706 |
| 2013/0003375 A1 * | 1/2013 | Hussell | 362/249.02 |

FOREIGN PATENT DOCUMENTS

| CN | 101441362 | 5/2009 |
| JP | 01-209751 | 8/1989 |
| JP | 09-148516 | 6/1997 |
| JP | 2003-23243 | 1/2003 |
| JP | 2007-141969 | 6/2007 |

* cited by examiner

*Primary Examiner* — Evan Dzierzynski
(74) *Attorney, Agent, or Firm* — WPAT, PC; Justin King

(57) ABSTRACT

A light-emitting diode light bar includes a printed circuit board and a light-emitting diode. The printed circuit board has a protective layer, a first signal line, and a first extension line. The LED is disposed on the first signal line and the first extension line. The protective layer is formed above the first signal line and the first extension line, and has an opening that exposes a portion of the first signal line, and a portion of the extension line, such that a first exposed length of the first signal line is substantially equal to a second exposed length of the first extension line.

20 Claims, 6 Drawing Sheets

LED LIGHT BAR AND BACKLIGHT MODULE

RELATED APPLICATIONS

This application claims priority to Taiwan Application Serial Number 100130730, filed Aug. 26, 2011, which is herein incorporated by reference.

TECHNICAL FIELD

The present disclosure generally relates to a light bar and a backlight module having the light bar. More particularly, the present disclosure relates to a light-emitting diode light bar and a backlight module having the light-emitting diode (LED) light bar.

BACKGROUND

Currently, light-emitting diodes (LEDs) are widely used in a backlight module for a liquid crystal display. The quantity of the light-emitting diodes is decreased to reduce the manufacture cost of the liquid crystal display, thus resulting in a larger gap between two adjacent LEDs. Therefore, the optical design and assembling precision of the backlight module are more and more challenging. One of the key factors is to precisely align the LEDs in the vertical direction of the backlight module.

Nowadays, the LEDs are fixed on a printed circuit board (PCB) of a light bar with the surface mounting technology (SMT). First, a solder paste is printed on the soldering pads of the printed circuit board. Second, the LEDs are placed on the soldering pads having the solder paste. Finally, the LEDs are fixed on the soldering pads by heating with a reflow furnace. However, even through the LEDs can be precisely placed on the soldering pads initially, yet portions of the signal lines connected and adjacent to the soldering pads are exposed without being covered by the solder mask layer of the PCB, the molten solder will be easily distributed fully on the exposed areas due to its surface tension property, thus causing the LEDs to be deviated from the original adhering positions on the soldering pads, also affecting the alignment precision of the LEDs in the vertical direction of the backlight module.

Therefore, there is a need to improve the alignment position of the LEDs in the vertical direction of the backlight module.

SUMMARY

One objective of the embodiments of the present invention is to provide a LED light bar of which light-emitting diodes can be precisely aligned to the soldering pads of a printed circuit board to effectively ensure positions of the LEDs in the vertical direction of the backlight module.

To achieve these and other advantages and in accordance with the objective of the embodiments of the present invention, as the embodiment broadly describes herein, the embodiments of the present invention provides a light emitting diode light bar including a printed circuit board (PCB) and a light-emitting diode. The printed circuit board includes a protective layer, a soldering pad, a first signal line, and a first extension line. The soldering pad is formed on the printed circuit board, and has a first side and a second side opposite to the first side. The first signal line is connected to the first side of the soldering pad, and the first extension line is connected to the second side of the soldering pad. The protective layer is formed on the first signal line and the first extension line, and has an opening to expose the soldering pad, a portion of the first signal line and a portion of the first extension line. The first signal line has a first exposed length and the first extension line has a second exposed length. The second exposed length is substantially equal to the first exposed length.

The first extension line is aligned with the first signal line. The first signal line has a first exposed width and the first extension line has a second exposed width. The second exposed width is substantially equal to the first exposed width. In addition, the first signal line and the first extension line are coplanar. The first signal line and the first extension line are collinear.

In one embodiment, the printed circuit board may further include a second signal line and a second extension line. The second signal line is connected to a third side of the soldering pad, and the second signal line has a third exposed length. The second extension line is connected to a fourth side of the soldering pad opposite to the third side. The second extension line has a fourth exposed length. The fourth exposed length is substantially equal to the third exposed length.

In addition, the second signal line is vertical to the first signal line. The second extension line is aligned with the second signal line. The second signal line has a third exposed width, and the second extension line has a fourth exposed width, and the fourth exposed width is substantially equal to the third exposed width. The second signal line and the second extension line are coplanar.

Alternatively, the light emitting diode light bar can include a printed circuit board (PCB) and a light-emitting diode. The printed circuit board further includes a first signal line, a first extension line and a protective layer formed above the first signal line and the first extension line. The protective layer has an opening to expose a portion of the first signal line and a portion of the first extension line, and the portion of the first signal line is symmetrical to the portion of the first extension line with a symmetrical axis. The light-emitting diode is fixed on the first signal line and the first extension line. The first signal line has a first exposed width and the first extension line has a second exposed width, and the second exposed width is substantially equal to the first exposed width. The first signal line has a first exposed length and the first extension line has a second exposed length, the second exposed length is substantially equal to the first exposed length. In addition, the first extension line can be formed by a plurality of extension strips, and the first signal line and the first extension line are coplanar. A lead of the light-emitting diode can be a V-shaped lead, a U-shaped lead or an I-shaped lead.

In addition, another embodiment according to the present invention is to provide a backlight module having the foregoing light emitting diode light bar, a light guide plate and a reflector. The light-emitting diode of the light emitting diode light bar has a first central axis, and the light guide plate is disposed adjacent to the light emitting diode light bar and has a second central axis. The position of the light-emitting diode connected to the soldering position on the soldering pad can be adjusted by using the extension line, thereby aligning the first central axis with the second central axis.

BRIEF DESCRIPTION OF THE DRAWINGS

The foregoing aspects and many of the attendant advantages of this invention will be more readily appreciated as the same becomes better understood by reference to the following detailed description, when taken in conjunction with the accompanying drawings, wherein.

DETAILED DESCRIPTION OF THE PREFERRED EMBODIMENT

The following description is of the best presently contemplated mode of carrying out the present disclosure. This description is not to be taken in a limiting sense but is made merely for the purpose of describing the general principles of the invention. The scope of the invention should be determined by referencing the appended claims.

Figure 1:
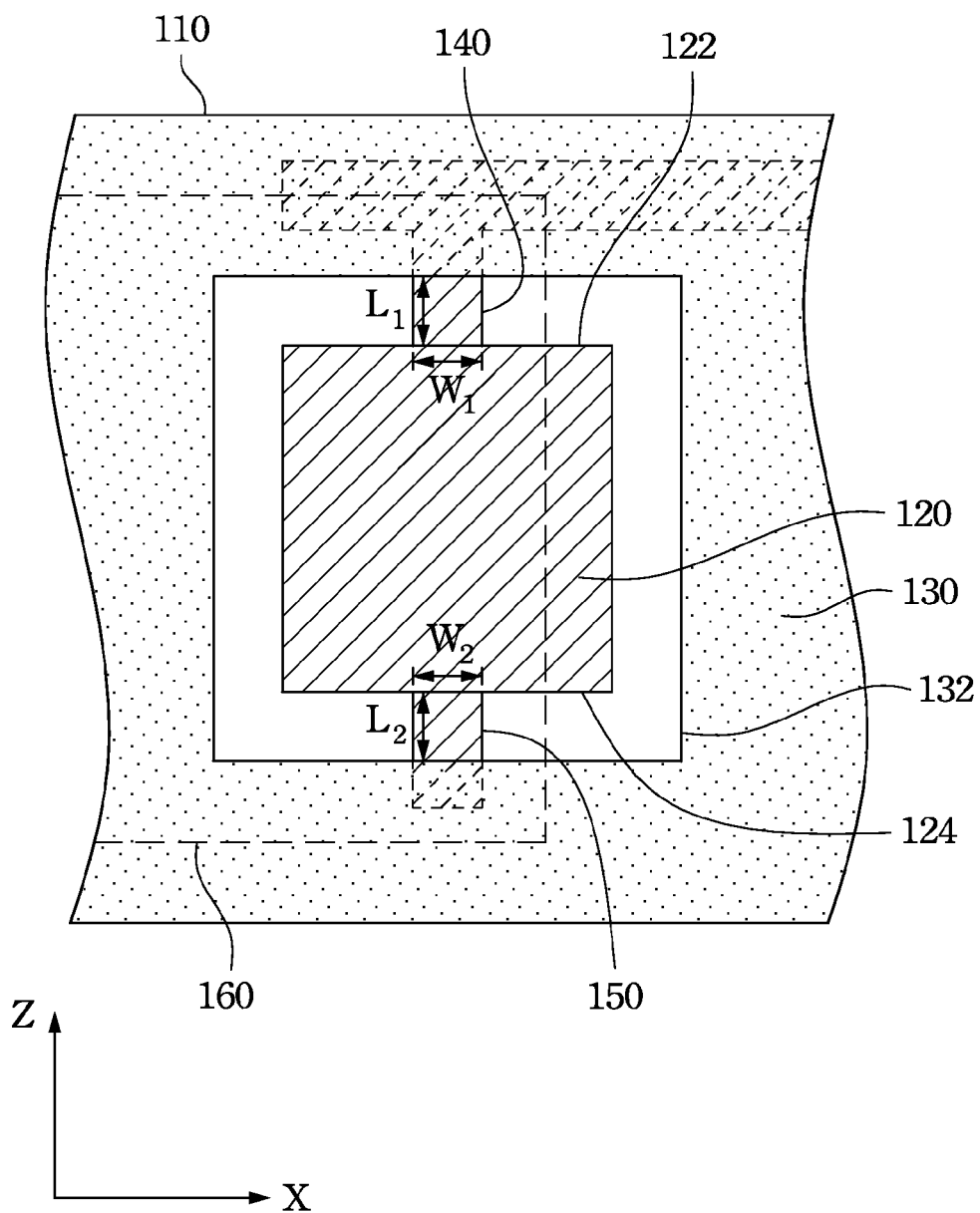
FIG. 1 illustrates a partial top view of a LED light bar according to a first embodiment of the present invention.
Figure 2:
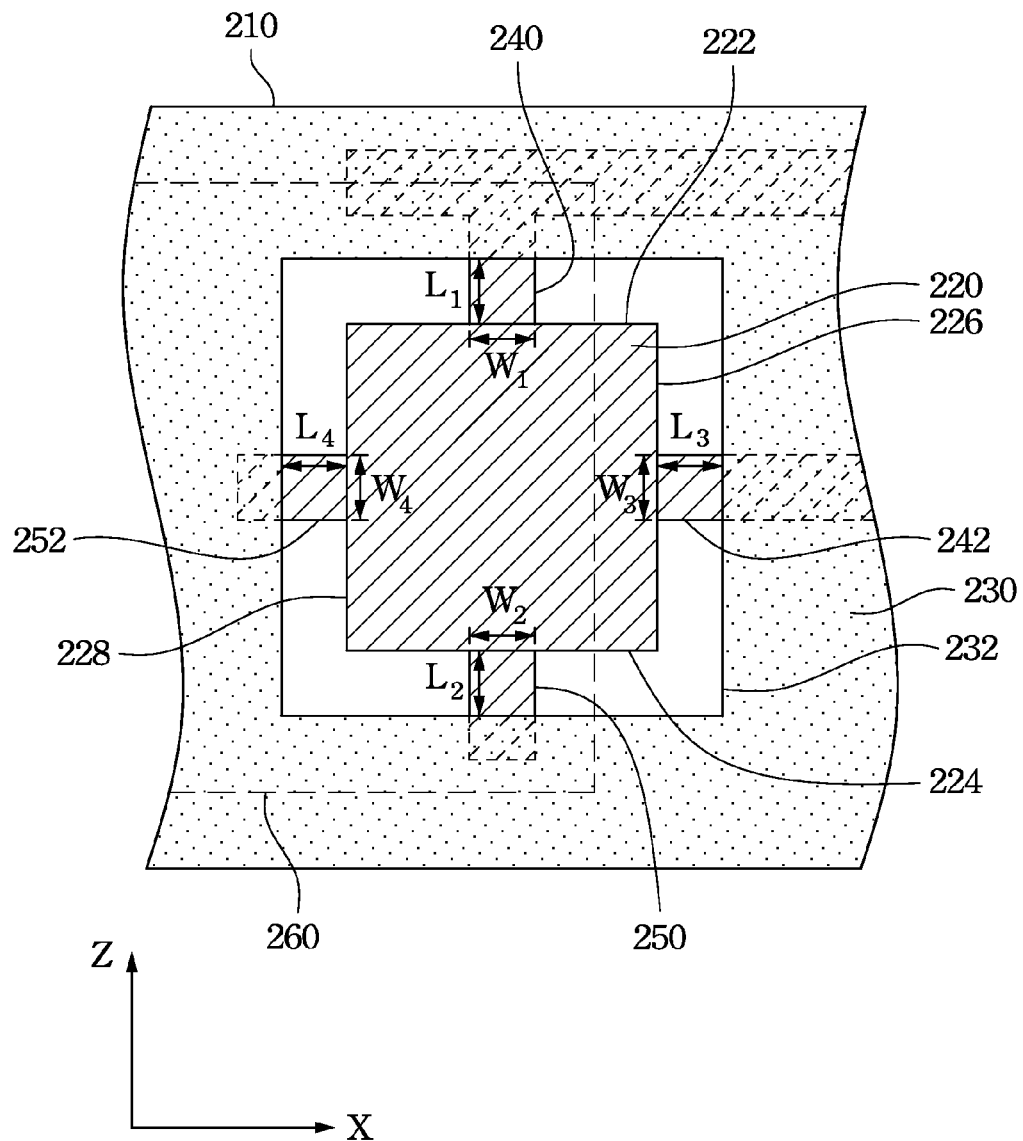
FIG. 2 illustrates a top view of a LED light bar according to a second embodiment of the present invention.

Refer to FIG. 1. FIG. 1 illustrates a partial top view of a LED light bar according to a first embodiment of the present invention. The LED light bar 100 includes a printed circuit board (PCB) 110 and a light-emitting diode 160 (for conveniently explaining the structure of the printed circuit board 110, the position of the light-emitting diode 160 is merely depicted by a dashed line), the printed circuit board 110 further includes a soldering pad 120, a solder mask layer 130, a first signal line 140, and a first extension line 150 for tension balance. Generally, the light-emitting diode 160 is fixed on the soldering pad 120 with solder and the light-emitting diode 160 can cover a partial area of the soldering pad 120 as illustrated in FIG. 2, but not limited to it.

The soldering pad 120, the first signal line 140 and the first extension line 150 for tension balance are formed by etching a metal layer on the printed circuit board 110, and are formed in the same layer on the printed circuit board (PCB) 110. The metal layer is made of, for example, copper. The soldering pad 120 is a rectangle or square, and has a first side 122 and a second side 124 opposite to the first side 122 in the vertical direction (Z-axis). The first signal line 140 is connected to the first side 122 for electrically connecting the soldering pad 120 to a power source or any other electrical device for providing electronic signals to the light-emitting diode 160 through the first signal line 140 and the soldering pad 120. The first extension line 150 for tension balance is connected to the second side 124 to balance the surface tension of a molten solder in the SMT process, and therefore the first extension line 150 for tension balance can only be connected to the soldering pad 120 and no other electrical components are connected to the first extension line 150. In this embodiment, the first extension line 150 for tension balance is aligned with the first signal line 140 along the Z-axis. For example, the first extension line 150 for tension balance and the first signal line 140 are collinear. In other words, the extensive direction of the first extension line 150 and the first signal line 140 are collinear. However, in another embodiment, the first extension line 150 for tension balance can be connected to any point of the second side 124 of the soldering pad 120. The solder mask layer 130, i.e. a protective layer, is formed on the first signal line 140 and the first extension line 150, and partially covers the first signal line 140 and the first extension line 150. The solder mask layer 130 has an opening 132 positioned corresponding to the soldering pad 120 to expose the soldering pad 120 for soldering the light-emitting diode 160 thereon.

The opening 132 of the solder mask layer 130 can not only expose the soldering pad 120 but also expose a portion of the first signal line 140 and a portion of the first extension line 150 for tension balance. The portion of the first signal line 140 exposed in the opening 132 has a first exposed metal length L1 and a first exposed metal width W1. The first exposed metal length L1 is a length of the first signal line 140 extending from the edge of the opening 132 of the solder mask layer 130 to the first side 122 of the soldering pad 120. The first exposed metal width W1 is a width of the first signal line 140 within the opening 132 of the solder mask layer 130. The portion of the first extension line 150 exposed in the opening 132 has a second exposed metal length L2 and a second exposed metal width W2. The second exposed metal length L2 is a length of the first extension line 150 extending from the edge of the opening 132 of the solder mask layer 130 to the second side 124 of the soldering pad 120. The second exposed metal width W2 is a width of the first extension line 150 within the opening 132 of the solder mask layer 130.

In a surface mounting technology (SMT) process for fixing the light-emitting diode 160 on the soldering pad 120, the molten solder tends to concentrate on the exposed sheet metal due to the surface tension thereof. In this embodiment, the second exposed metal length L2 of the first extension line 150 for tension balance is substantially equal to a first exposed metal length L1 of the first signal line 140, that is, the exposed metal lengths of the exposed sheet metals beside the soldering pad 120 are substantially equal in the vertical direction (Z-axis). Therefore, the surface tension of the molten solder on the exposed sheet metal can be balanced in the vertical direction (Z-axis), so that the light-emitting diode 160 can be exactly aligned with the soldering pad 120.

In addition, symmetrical and equal exposed areas of the exposed sheet metals beside the soldering pad in the vertical direction (Z-axis) can further ensure the surface tension balance thereof. For example, not only the first exposed metal length L1 is substantially equal to the second exposed metal length L2, but also the first exposed metal width W1 is substantially equal to the second exposed metal width W2.

Refer to FIG. 2. FIG. 2 illustrates a top view of a LED light bar according to a second embodiment of the present invention. The first signal line 240 and the first extension line 250 for tension balance are similar to those of the first embodiment and are respectively connected to the first side 222 and the second side 224 opposite to the first side 222 of the soldering pad 220 in the vertical direction (Z-axis). In this embodiment, the printed circuit board 210 has an additional conductive line. That is, the soldering pad 220 has a third side 226 and a fourth side 228 opposite to the third side 226 in the horizontal direction (X-axis). The second signal line 242 is connected to the third side 226, and is substantially vertical to the first signal line 240, and therefore the second signal line 242 can electrically connect the soldering pad 220 to a power source or any other electrical device for providing electronic signals to the light-emitting diode 260 through the second signal line 242 and the soldering pad 220. The second extension line 252 is connected to the fourth side 228 to balance the surface tension of the molten solder in the SMT process, and the second extension line 252 is not necessary to be electrically connected to any other addition electrical device. In one embodiment, the second extension line 252 for tension balance is preferably aligned with the second signal line 242 in the X-axis. Furthermore, the second extension line 252 for tension balance can also be connected to any other point along the fourth side 228 of the soldering pad 220.

The opening 232 of the solder mask layer 230 can expose a portion of the first signal line 240, a portion of the first extension line 250 for tension balance, a portion of the second signal line 242 and a portion of the second extension line 252 for tension balance. The portion of the first signal line 240 has a first exposed metal length L1 and a first exposed metal width W1. The first exposed metal length L1 is a length of the first signal line 240 extending from the edge of the opening 232 of the solder mask layer 230 to the first side 222 of the soldering pad 220. The first exposed metal width W1 is a width of the first signal line 240 within the opening 232 of the solder mask layer 230. The portion of the first extension line 250 for tension balance has a second exposed metal length L2 and a second exposed metal width W2. The second exposed metal length L2 is a length of the first extension line 250 for tension balance extending from the edge of the opening 232 of the solder mask layer 230 to the second side 224 of the soldering pad 220. The second exposed metal width W2 is a width of the first extension line 250 for tension balance within the opening 232 of the solder mask layer 230.

The portion of the second signal line 242 has a third exposed metal length L3 and a third exposed metal width W3. The third exposed metal length L3 is a length of the second signal line 242 extending from the edge of the opening 232 of the solder mask layer 230 to the third side 226 of the soldering pad 220. The third exposed metal width W3 is a width of the second signal line 242 within the opening 232 of the solder mask layer 230. The portion of the second extension line 252 for tension balance has a fourth exposed metal length L4 and a fourth exposed metal width W4. The fourth exposed metal length L4 is a length of the second extension line 252 extending from the edge of the opening 232 of the solder mask layer 230 to the fourth side 228 of the soldering pad 220. The fourth exposed metal width W4 is a width of the second extension line 252 for tension balance within the opening 232 of the solder mask layer 230.

In this embodiment, besides the second exposed metal length L2 of the first extension line 250 is substantially equal to the first exposed metal length L1 of the first signal line 240, and the fourth exposed metal length L4 of the second extension line 252 is substantially equal to the third exposed metal length L3 of the second signal line 242. That is, the exposed sheet metals beside the soldering pad 220 have substantially equal exposed metal lengths in the Z-axis. In addition, the exposed sheet metals beside the soldering pad 220 have substantially equal exposed metal lengths in the X-axis. Therefore, the surface tensions of the molten solder can be balanced not only in the Z-axis but also in the X-axis so that the light-emitting diode 260 can effectively aim at the soldering pad 220.

In addition, symmetric and equal areas of the exposed sheet metal beside the soldering pad 220 along the X-axis can further ensure the surface tension balance for the molten solder. For example, the third exposed metal length L3 is substantially equal to the fourth exposed metal length L4, and as well the third exposed metal width W3 is substantially equal to the fourth exposed metal width W4.

Figure 3:
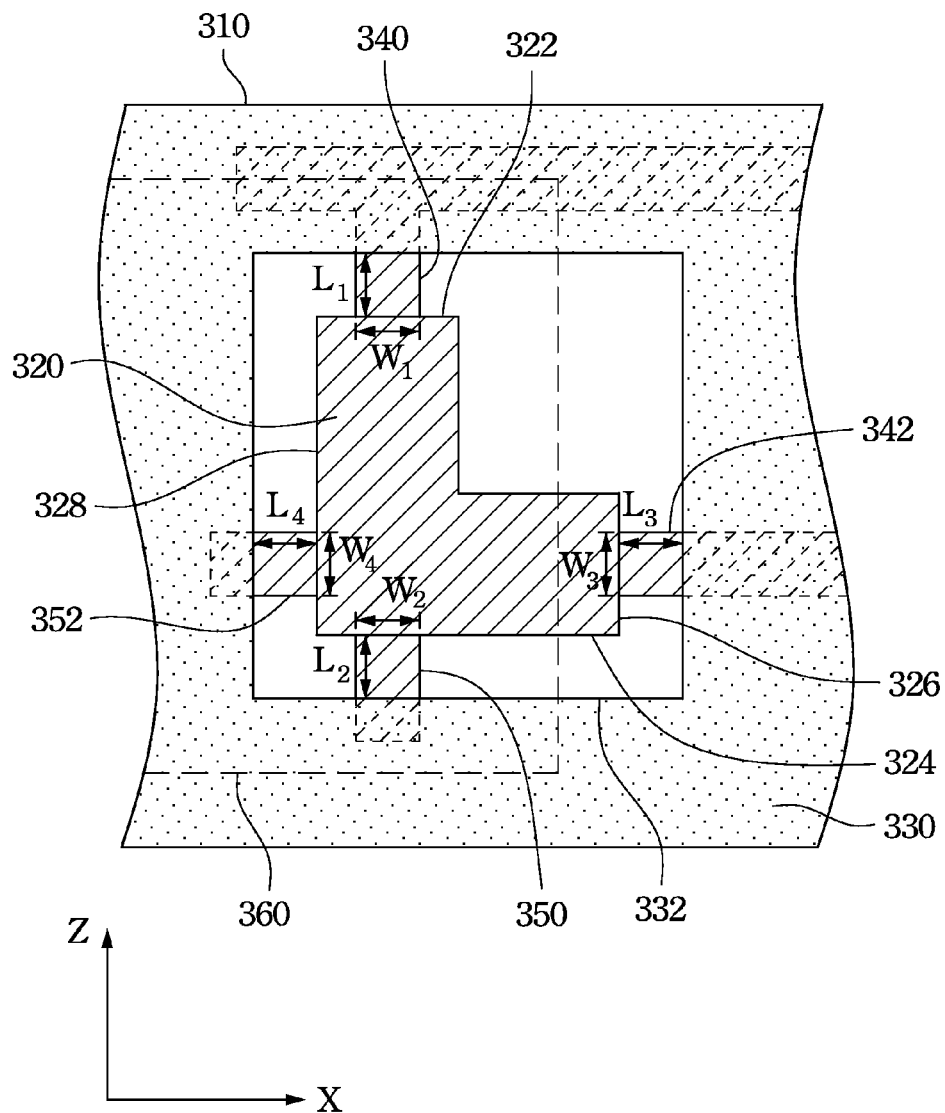
FIG. 3 illustrates a top view of a LED light bar having an L-shaped soldering pad according to the present invention.

The soldering pads of the foregoing embodiments are rectangular soldering pads or square soldering pads. However, a different shape soldering pad design for another LED light bar 300 is provided to fit the different terminals of the light-emitting diodes. Refer to FIG. 3. The soldering pad 320 can be L-shaped. The soldering pad 320 is formed on the printed circuit board 310, and has a first side 322 and a second side 324 opposite to the first side 322 along the vertical direction (Z-axis), and has a third side 326 and a fourth side 328 along the horizontal direction (X-axis). The first signal line 340 is connected to the first side 322, a first extension line 350 for tension balance is connected to the second side 324, and a second signal line 342 is connected to the third side 326, and the second extension line 352 for tension balance is connected to the fourth side 328. The first signal line 322 and the second signal line 342 are used to connect the soldering pad 320 to the power source or any other electrical device for providing electronic signals to the light-emitting diode 360 through the first signal line 322 and the soldering pad 320. The first extension line 350 and the second extension line 352 can effectively balance the surface tension of the molten solder in the SMT process and are not necessary to be electrically connected to any additional device.

An opening 332 of a solder mask layer 330 exposes a portion of the first signal line 340, a portion of the second signal line 342, a portion of the first extension line 350 for tension balance and a portion of the second extension line 352 for tension balance. The portion of the first signal line 340 has a first exposed metal length L1 and a first exposed metal width W1. The portion of the first extension line 350 for tension balance has a second exposed metal length L2 and a second exposed metal width W2, and the portion of the second signal line 342 has a third exposed metal length L3 and a third exposed metal width W3, and the portion of the second extension line 352 for tension balance has a fourth exposed metal length L4 and a fourth exposed metal width W4.

In addition, the second exposed metal length L2 of the first extension line 350 is substantially equal to the first exposed metal length L1 of the first signal line 340. The fourth exposed metal length L4 of the second extension line 352 is substantially equal to the third exposed metal length L3 of the second signal line 342. Therefore, the surface tension of the molten solder can be balanced in the Z-axis and in the X-axis to effectively align the light-emitting diode 360 with the soldering pad 320.

Figure 4:
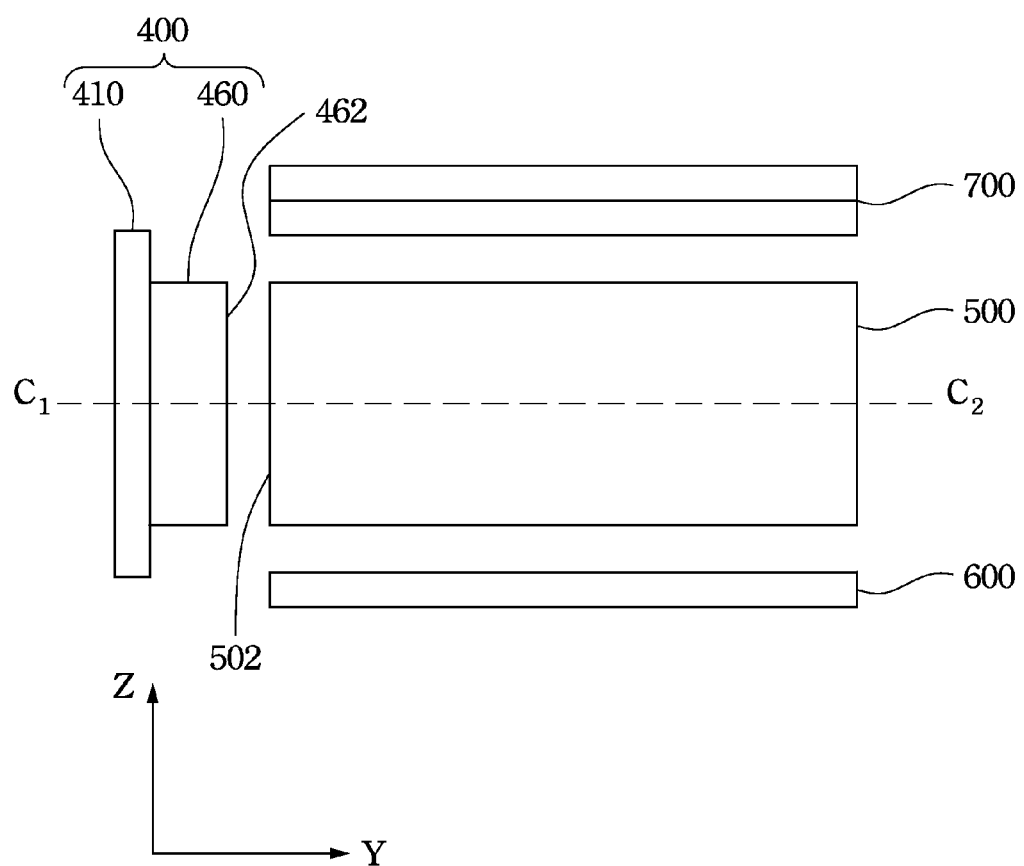
FIG. 4 illustrates a cross-sectional view of a backlight module according to the present invention.

The foregoing LED light bar having the extension lines for tension balance can be further used in the backlight module. For example, as shown in FIG. 4, a backlight module 40 includes a LED light bar 400, a light guide plate 500 disposed adjacent to the LED light bar 400, a reflector 600 disposed under the light guide plate 500, and an optical film module 700 disposed above the light guide plate 500. The LED light bar 400 includes a printed circuit board 410 having the extension lines for tension balance and a light-emitting diode 460. The light-emitting diode 460 has a first central axis C1, e.g. the central normal line of a light emitting surface 462 of the light-emitting diode 460. The first central axis C1 is vertically disposed around one half of the height of the light-emitting diode 460 (along the Z-axis). In addition, the light guide plate 500 has a second central axis C2, e.g. the central normal line of a light incident surface 502 of the light guide plate 500. The second central axis C2 is vertically disposed around one half of the height of the light guide plate 500 (along the Z-axis). The extension lines for tension balance according to the present disclosure can effectively adjust the position of the light-emitting diode 460 on the soldering pad of the printed circuit board 410 to align the first central axis C1 with the second central axis C2, thereby exactly positioning the light-emitting diode 460 on the backlight module 40 in the vertical direction (Z-axis).

Figure 5:
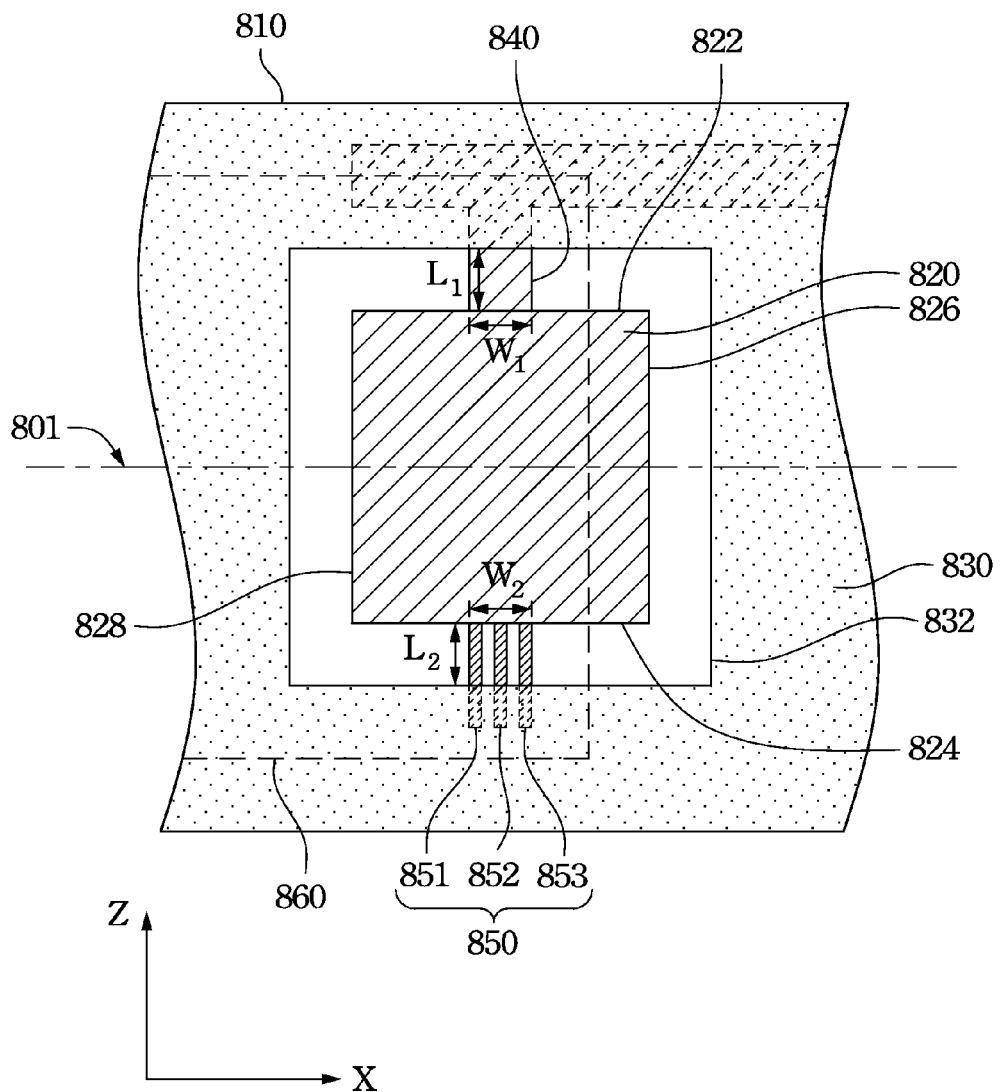
FIG. 5 illustrates a top view of a LED light bar according to a further embodiment of the present invention.

Refer to FIG. 5. FIG. 5 illustrates a top view of a LED light bar according to a further embodiment of the present invention. The first signal line 840 and the first extension line 850 for tension balance are similar to those of the first embodiment and are respectively connected to the first side 822 and the second side 824 opposite to the first side 822 of the soldering pad 820 in the vertical direction (Z-axis). The first extension line 850 is not necessary to be electrically connected to any other addition electrical device. In one embodiment, the first extension line 850 for tension balance is aligned with the first signal line 840. For example, the first extension line 850 for tension balance and the first signal line 840 are collinear.

The opening 832 of the solder mask layer 830 can expose a portion of the first signal line 840, a portion of the first extension line 850 for tension balance. The portion of the first signal line 840 has a first exposed metal length L1 and a first exposed metal width W1. The first exposed metal length L1 is a length of the first signal line 840 extending from the edge of the opening 832 of the solder mask layer 830 to the first side 822 of the soldering pad 820. The first exposed metal width W1 is a width of the first signal line 840 within the opening 832 of the solder mask layer 830. The portion of the first extension line 850 for tension balance has a second exposed metal length L2 and a second exposed metal width W2. The second exposed metal length L2 is a length of the first extension line 850 for tension balance extending from the edge of the opening 832 of the solder mask layer 830 to the second side 824 of the soldering pad 820. The second exposed metal width W2 is a width of the first extension line 850 for tension balance within the opening 832 of the solder mask layer 830. In this embodiment, the portion of the first extension line 850 for tension balance is symmetrical to the portion of the first signal line 840 with a symmetrical axis 801. The symmetrical axis 801 means the middle line crosses through the opening 832 along the X axis. For example, the second exposed metal length L2 of the first extension line 850 is substantially equal to the first exposed metal length L1 of the first signal line 240, and the second exposed metal width W2 of the first extension line 850 for tension balance is substantially equal to the first exposed metal width W1 of the first signal line 840 within the opening 832 of the solder mask layer 830. In another embodiment, the symmetrical axis 801 is the middle line crosses through the opening 832 along the Z axis. The first extension line 850 and first signal line 840 are exposed in the different side of the symmetrical axis 801, but not limited to it. For example, the symmetrical axis 801 can be a diagonal line crosses through the opening 832.

Figure 6:
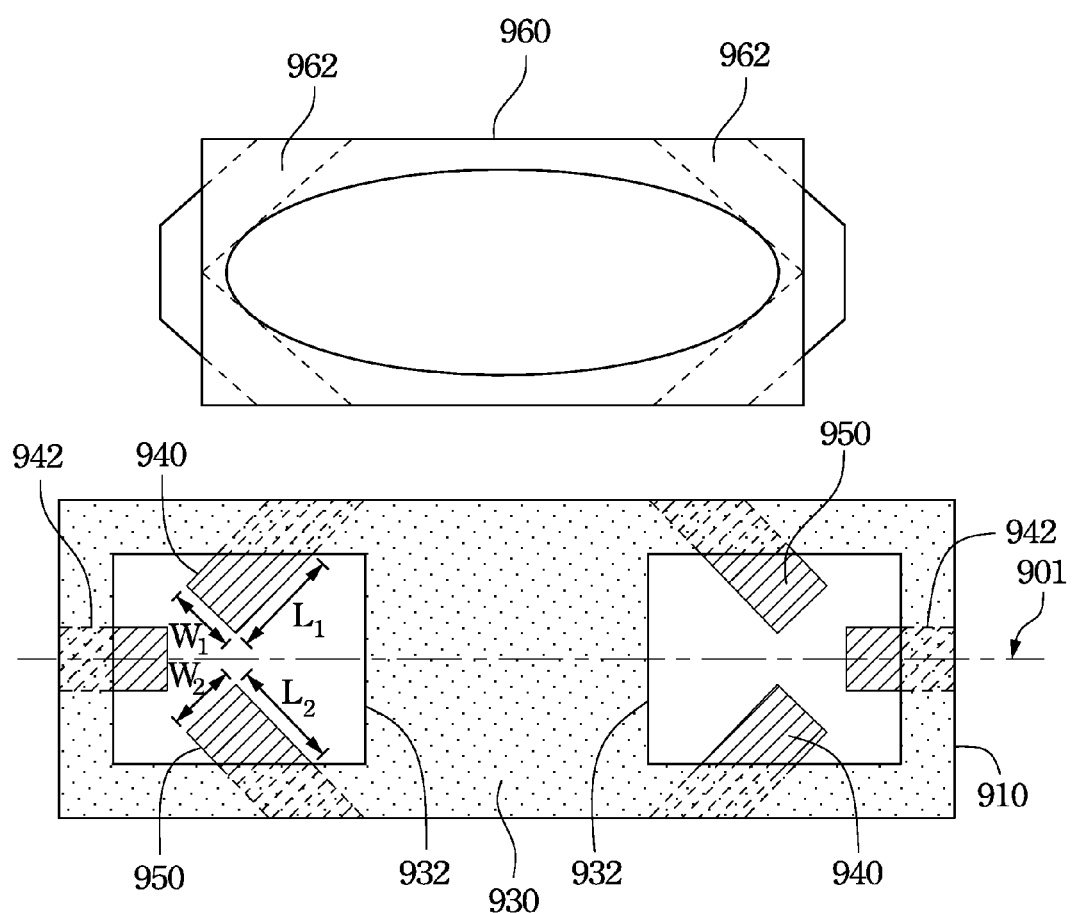
FIG. 6 illustrates a top view of a LED and a print circuit board of a LED light bar according to a still further embodiment of the present invention.

In addition, the first extension line 850 can be formed by a plurality of extension strips. As FIG. 6 shown, the first extension line 850 has the first extension strip 851, the second extension strip 852 and the third extension strip 853, but not limited to it. For example, the first extension line 850 has the two or more than two extension strips. In this embodiment, the second exposed metal width W2 is calculated from the first extension strip 851 to the third extension strip 853. That is to say, the second exposed metal width W2 is equal to the sum of the width of the extension strips and the gap between extension strips. For example, the second exposed metal width W2 is sum of the width of the first extension strip 851, the width of the second extension strip 852, the width of the third extension strip 853, the gap between the first extension 851 and the second extension 852 and the gap between the second extension 852 and the third extension 853. In this embodiment, the second exposed metal width W2 of the first extension line 850 within the opening 832 of the solder mask layer 830 is also substantially equal to the first exposed metal width W1 of the first signal line 840 within the opening 832 of the solder mask layer 830. Further, the first signal line 840 and the first extension line 850 are coplanar. In addition, the first signal line 840 and the first extension line 850 are collinear. In other words, a plurality of the extension strips 851, 852, 853 are individually collinear with the first signal line 840.

As FIG. 5 shown, the widths of the extension strips 851, 852, 853 are the same, but not limited to it. For example, the width of the first extension strip 851 is bigger than the width of the second extension strip 852 and the width of the second extension strip 852 is bigger than the width of the third extension strip 853. As the second exposed metal width W2 is satisfied with the first exposed metal width W1, the variety of width of the extension strips is accepted.

Refer to FIG. 6. FIG. 6 illustrates a top view of a LED and a print circuit board of a LED light bar according to a still further embodiment of the present invention. In this embodiment, the LED light bar 900 includes a printed circuit board (PCB) 910 and a light-emitting diode 960. The printed circuit board 910 further includes a solder mask layer 930, a first signal line 940, and a first extension line 950 for tension balance.

The first signal line 940 and the first extension line 950 for tension balance are formed by etching a metal layer on the printed circuit board 910, and are formed in the same layer on the printed circuit board (PCB) 910, i.e. the first signal line 940 and the first extension line 950 are coplanar. The metal layer is made of, for example, copper.

The light-emitting diode 960 is fixed on the first signal line 940 electrically connecting to a power source or any other electrical device for providing electronic signals to the light-emitting diode 960 through the first signal line 940. The solder mask layer 930, i.e. a protective layer, is formed on the first signal line 940 and the first extension line 950, and partially covers the first signal line 940 and the first extension line 950. The solder mask layer 930 has an opening 932 to expose the first signal line 940 and a portion of the first extension line 950 for soldering the light-emitting diode 960 thereon.

The opening 932 of the solder mask layer 930 can expose a portion of the first signal line 940 and a portion of the first extension line 950 for tension balance. The portion of the first signal line 940 exposed in the opening 932 has a first exposed metal length L1 and a first exposed metal width W1. The first exposed metal length L1 is a length of the first signal line 940 extending from the edge of the opening 932 of the solder mask layer 930. The first exposed metal width W1 is a width of the first signal line 940 within the opening 932 of the solder mask layer 930. The portion of the first extension line 950 exposed in the opening 932 has a second exposed metal length L2 and a second exposed metal width W2. The second exposed metal length L2 is a length of the first extension line 950 extending from the edge of the opening 932 of the solder mask layer 930. The second exposed metal width W2 is a width of the first extension line 950 within the opening 932 of the solder mask layer 930.

In this embodiment, the portion of the first extension line 950 for tension balance is symmetrical to the portion of the first signal line 940 with a symmetrical axis 901. The symmetrical axis 901 means the middle line crosses through the opening 932 along the X axis. For example, the second exposed metal length L2 of the first extension line 950 for tension balance is substantially equal to a first exposed metal length L1 of the first signal line 940, and the second exposed metal width W2 of the first extension line 950 is substantially equal to the first exposed metal width W1 of the first signal line 940 within the opening 932 of the solder mask layer 930. In another embodiment, the symmetrical axis 901 is the middle line crosses through the opening 932 along the Z axis. The first extension line 950 and first signal line 940 are exposed in the different side of the symmetrical axis 901, but not limited to it. For example, the symmetrical axis 901 is the diagonal line crosses through the opening 932.

Furthermore, light-emitting diode leads 962 of the light-emitting diode 960 can be V-shaped leads, U-shaped leads or I-shaped leads to be fixed on the first signal line 940 and the first extension line 950. In addition, the printed circuit board (PCB) 910 can further has a second signal line 942 to fix with the light-emitting diode leads 962 of the light-emitting diode 960. The first extension line 950 can be formed by a plurality of first extension strips and the second exposed metal width W2 of the first extension strips of the first extension line 950 for tension balance within the opening 932 of the solder mask layer 930 is substantially equal to the first exposed metal width W1 of the first signal line 940 within the opening 932 of the solder mask layer 930. Further, the first signal line 940, the first extension line 950 and the first extension line 850 are coplanar.

As is understood by a person skilled in the art, the foregoing preferred embodiments of the present invention are illustrative of the present invention rather than limiting of the present invention. It is intended that various modifications and similar arrangements be included within the spirit and scope of the appended claims, the scope of which should be accorded the broadest interpretation so as to encompass all such modifications and similar structures.

What is claimed is:

1. A light emitting diode light bar, comprising:
   a printed circuit board (PCB), wherein the printed circuit board further comprises:
      a soldering pad formed on the printed circuit board, the soldering pad comprising a first side and a second side opposite to the first side;
      a first signal line connecting to the first side of the soldering pad;
      a first extension line connecting the second side of the soldering pad; and
      a protective layer formed above the first signal line and the first extension line, the protective layer having an opening to expose the soldering pad, a portion of the first signal line and a portion of the first extension line, wherein the first signal line has a first exposed length and the first extension line has a second exposed length, the second exposed length is substantially equal to the first exposed length; and
   a light-emitting diode fixed on the soldering pad.

2. The light emitting diode light bar of claim 1, wherein the first extension line is aligned with the first signal line.

3. The light emitting diode light bar of claim 1, wherein the first signal line has a first exposed width and the first extension line has a second exposed width, wherein the second exposed width is substantially equal to the first exposed width.

4. The light emitting diode light bar of claim 1, wherein the first signal line and the first extension line are coplanar.

5. The light emitting diode light bar of claim 1, wherein the first signal line and the first extension line are collinear.

6. The light emitting diode light bar of claim 1, wherein the printed circuit board further comprises:
   a second signal line connected to a third side of the soldering pad, wherein the second signal line has a third exposed length; and
   a second extension line connected to a fourth side of the soldering pad opposite to the third side, wherein the second extension line has a fourth exposed length, and the fourth exposed length is substantially equal to the third exposed length.

7. The light emitting diode light bar of claim 6, wherein the second signal line is vertical to the first signal line.

8. The light emitting diode light bar of claim 6, wherein the second extension line is aligned with the second signal line.

9. The light emitting diode light bar of claim 6, wherein the second signal line has a third exposed width, and the second extension line has a fourth exposed width, and the fourth exposed width is substantially equal to the third exposed width.

10. The light emitting diode light bar of claim 6, wherein the second signal line and the second extension line are coplanar.

11. A backlight module, comprising:
    a light emitting diode light bar, wherein the light emitting diode light bar comprises:
       a printed circuit board (PCB), wherein the printed circuit board further comprises:
          a soldering pad formed on the printed circuit board, the soldering pad comprising a first side and a second side opposite to the first side;
          a first signal line connected to the first side of the soldering pad;
          a first extension line connected to the second side of the soldering pad; and
          a protective layer formed on the first signal line and the first extension line, the protective layer having an opening to expose the soldering pad, a portion of the first signal line and a portion of the first extension line, wherein the portion of the first signal line has a first exposed length and the portion of the first extension line has a second exposed length, wherein the second exposed length is substantially equal to the first exposed length; and
       a light-emitting diode fixed on the soldering pad;
    a light guide plate disposed adjacent to the light emitting diode light bar; and
    a reflector disposed under the light guide plate.

12. The backlight module of claim 11, wherein the first extension line is aligned with the first signal line.

13. The backlight module of claim 11, wherein the portion of the first signal line has a first exposed width and the portion of the first extension line has a second exposed width, wherein the second exposed width is substantially equal to the first exposed width.

14. The backlight module of claim 11, wherein the first signal line and the first extension line are coplanar.

15. A light emitting diode light bar, comprising:
    a printed circuit board (PCB), wherein the printed circuit board further comprises:
       a first signal line;
       a first extension line; and
       a protective layer formed above the first signal line and the first extension line, the protective layer having an opening to expose a portion of the first signal line and a portion of the first extension line, wherein the portion of the first signal line is symmetrical to the portion of the first extension line with a symmetrical axis; and
    a light-emitting diode fixed on the first signal line and the first extension line.

16. The light emitting diode light bar of claim 15, wherein the first signal line has a first exposed width and the first extension line has a second exposed width, wherein the second exposed width is substantially equal to the first exposed width.

17. The light emitting diode light bar of claim 16, wherein the first extension line is formed by a plurality of extension strips.

18. The light emitting diode light bar of claim 15, wherein the first signal line and the first extension line are coplanar.

19. The light emitting diode light bar of claim 15, wherein the first signal line has a first exposed length and the first extension line has a second exposed length, the second exposed length is substantially equal to the first exposed length.

20. The light emitting diode light bar of claim 15, wherein a lead of the light-emitting diode is a V-shaped lead, a U-shaped lead or an I-shaped lead.

* * * * *